United States Patent [19]
Philipp

[11] 4,283,713
[45] Aug. 11, 1981

[54] WAVEFORM ACQUISITION CIRCUIT

[75] Inventor: Harald Philipp, Beaverton, Oreg.

[73] Assignee: Tektronix, Inc., Beaverton, Oreg.

[21] Appl. No.: 3,141

[22] Filed: Jan. 15, 1979

[51] Int. Cl.³ .......................................... H03K 13/02
[52] U.S. Cl. ........................... 340/347 SH; 315/367;
315/377; 324/102; 324/121 R; 328/129;
328/130; 328/151; 340/347 M; 340/347 AD
[58] Field of Search ............... 324/77 A, 77 B, 77 G,
324/83 R, 121 R, 102, 131; 315/367, 377;
340/347 M, 347 AD; 364/734, 111, 112;
328/151, 129, 130

[56] References Cited

U.S. PATENT DOCUMENTS

| | | | |
|---|---|---|---|
| 3,192,519 | 6/1965 | Anderson | 340/347 AD |
| 3,456,189 | 7/1969 | Hornak | 324/141 R |
| 3,484,591 | 12/1969 | Trimble | 364/734 |
| 3,662,380 | 5/1972 | Cargile | 340/347 AD |
| 3,816,815 | 6/1974 | Schumann | 324/102 X |
| 3,836,851 | 9/1974 | Schumann | 324/121 R X |
| 4,047,115 | 9/1977 | Toda et al. | 328/151 |
| 4,068,310 | 1/1978 | Friauf | 324/121 R X |
| 4,074,190 | 2/1978 | Bunting | 324/77 A |
| 4,117,722 | 10/1978 | Helmstetter | 73/362 AR |

*Primary Examiner*—Thomas J. Sloyan
*Attorney, Agent, or Firm*—George T. Noe

[57] ABSTRACT

A waveform acquisition circuit for both real-time and equivalent-time acquisition modes with a smooth transition between modes. The circuit includes a control circuit which causes an analog-to-digital converter to take samples of an analog waveform in precise time relationship with preselected data points along the time axis of the waveform. The data points may be preselected in accordance with a variable increment.

7 Claims, 5 Drawing Figures

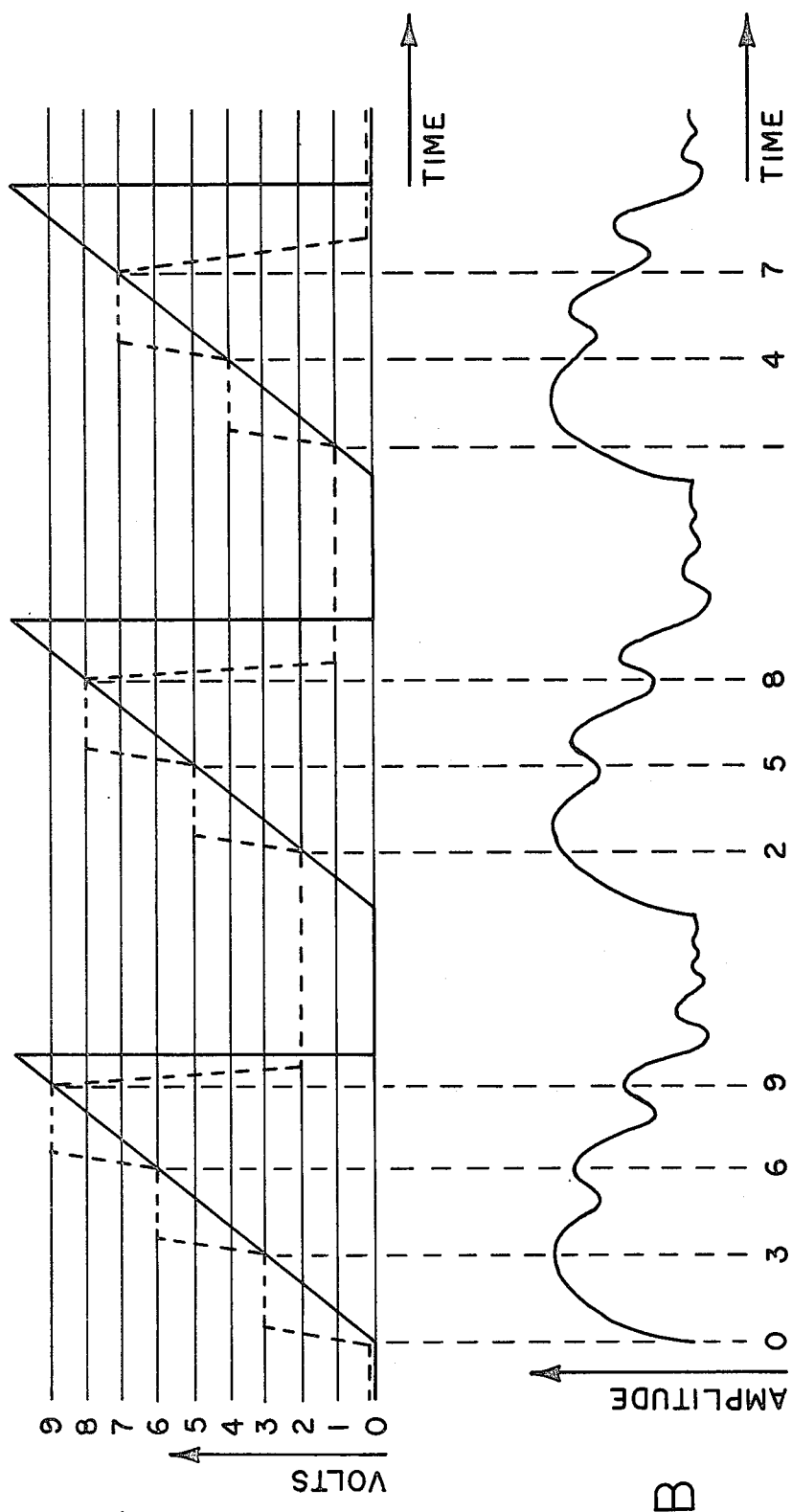
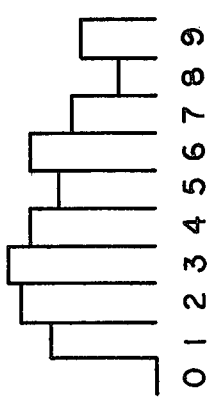
FIG 2A
FIG 2B
FIG 2C

WAVEFORM ACQUISITION CIRCUIT

BACKGROUND OF THE INVENTION

The present invention relates to waveform digitizing apparatus in general, and to waveform acquisition circuits in particular.

In general, oscilloscopes receive time-varying, or analog signals and graphically display the instantaneous amplitudes thereof against an internally-generated time-base sweep. These graphic displays, wherein time is plotted on the X, or horizontal, axis and amplitude is plotted on the Y, or vertical, axis, are known in the art as waveforms. Appropriate scaling of the waveform displays is provided by the oscilloscope selectable vertical gain and sweep rate controls, so that generally, a wide range of input signal amplitudes and frequencies may be accomodated. The waveform, then, is a visual representation of some electrical event, which may be either repetitive or single shot.

Waveform digitizing oscilloscopes convert the input analog signal to digital form so that a waveform may be processed by digital circuitry, which may include storage for later recall, transmission to some other location, or mathematical manipulation. The waveform acquisition is typically achieved by use of an analog-to-digital converter which samples instantaneous values of the input signal at predetermined points along the waveform and provides a digital coded signal or data words corresponding to such values. To ensure complete waveform acquisition, a predetermined number of sampling data points are provided within a time window, which window may be defined as the length of the time-base sweep, and thus the width of the time window varies in accordance with the sweep rate.

Two separate waveform acquisition techniques are generally used in present day oscilloscopes having a wide range of selectable sweep rates. These are known as real-time acquisition, wherein all of the waveform points are acquired in a single sweep, and equivalent-time acquisition, wherein all of the points are acquired one point per sweep on successive sweeps. Generally, realtime acquisition is used for the slower sweep rates where all of the points may be acquired within the conversion speed capability of the analog-to-digital converter, while equivalent-time acquisition is used for the higher sweep rates where the one point per sweep acquisition is also within conversion speed capability of the analog-to-digital converter. Because of the different mechanics involved in real-time and equivalent-time acquisition, two independent operating modes were heretofore required. The system was designed so that at lower sweep rates up to the fastest sweep rate for which real-time acquisition is feasible, i.e., within the conversion-speed capability of the analog-to-digital converter, a first operating mode would be utilized; at the higher sweep rates, the system would be switched to equivalent-time acquisition, utilizing a second operating mode, and the analog-to-digital converter would operate only once per sweep. It can be discerned that in the prior art systems there is not a smooth transition from real-time acquisition to equivalent-time acquisition as the sweep rate is increased through its range, and at the slowest equivalent-time acquisition rate wherein only one data point on the waveform is sampled each sweep, it may take a considerable amount of time to acquire all of the data points.

SUMMARY OF THE INVENTION

In accordance with the present invention, a waveform acquisition circuit capable of both real-time and equivalent-time acquisition with a smooth transition between operating modes is provided; that is, the number of data points sampled per sweep may be varied from all points per sweep to one point per sweep by varying the data point increment. For a given system, a predetermined number of substantially equally-spaced data points are established along the time axis of the display. An analog-to-digital converter receives convert pulses in precise timing relationship with the data points to cause the analog values of the waveform at the data points to be sampled and converted to digital form. A control circuit is provided to establish the data point increment at which convert pulses are produced along the waveform on each sweep, the increment being added to a number which represents the data point just sampled. The increment may be set to one in cases where the sweep is slow enough to permit all of the data points to be sampled in one sweep. As the sweep rate is increased, the increment may be increased to two (every other data point), three (every third data point), and so on as necessary, in each case staying within the conversion speed capability of the analog-to-digital converter and at the same time making maximum effective use of the analog-to-digital converter. Furthermore, if the increment is odd with respect to the number of data points, all of the points will be sampled without any one point being repeated within a given acquisition cycle. Also, the data point number generated by the control circuit is utilized as the memory address so that adjacent data points may be sampled on different repetitive sweeps and yet be stored in the proper sequence.

It is therefore one object of the present invention to provide a novel waveform acquisition circuit.

It is another object to provide a waveform acquisition circuit in which the number of data points sampled per sweep may be varied from all points per sweep to one point per sweep by varying the data point increment.

It is another object to provide a waveform acquisition circuit in which maximum effective use is made of an analog-to-digital converter within the conversion speed capability thereof.

It is a further object to provide a waveform acquisition circuit having a variable sampling increment wherein no data point will be sampled twice in a given acquisition cycle.

Other objects and advantages will become apparent to those having ordinary skill in the art upon a reading of the following description when taken in conjunction with the accompanying drawings.

BRIEF DESCRIPTION OF THE DRAWINGS

FIGS. 2A to 2C are idealized waveforms showing one complete acquisition cycle.

DETAILED DESCRIPTION OF THE INVENTION

Figure 1:
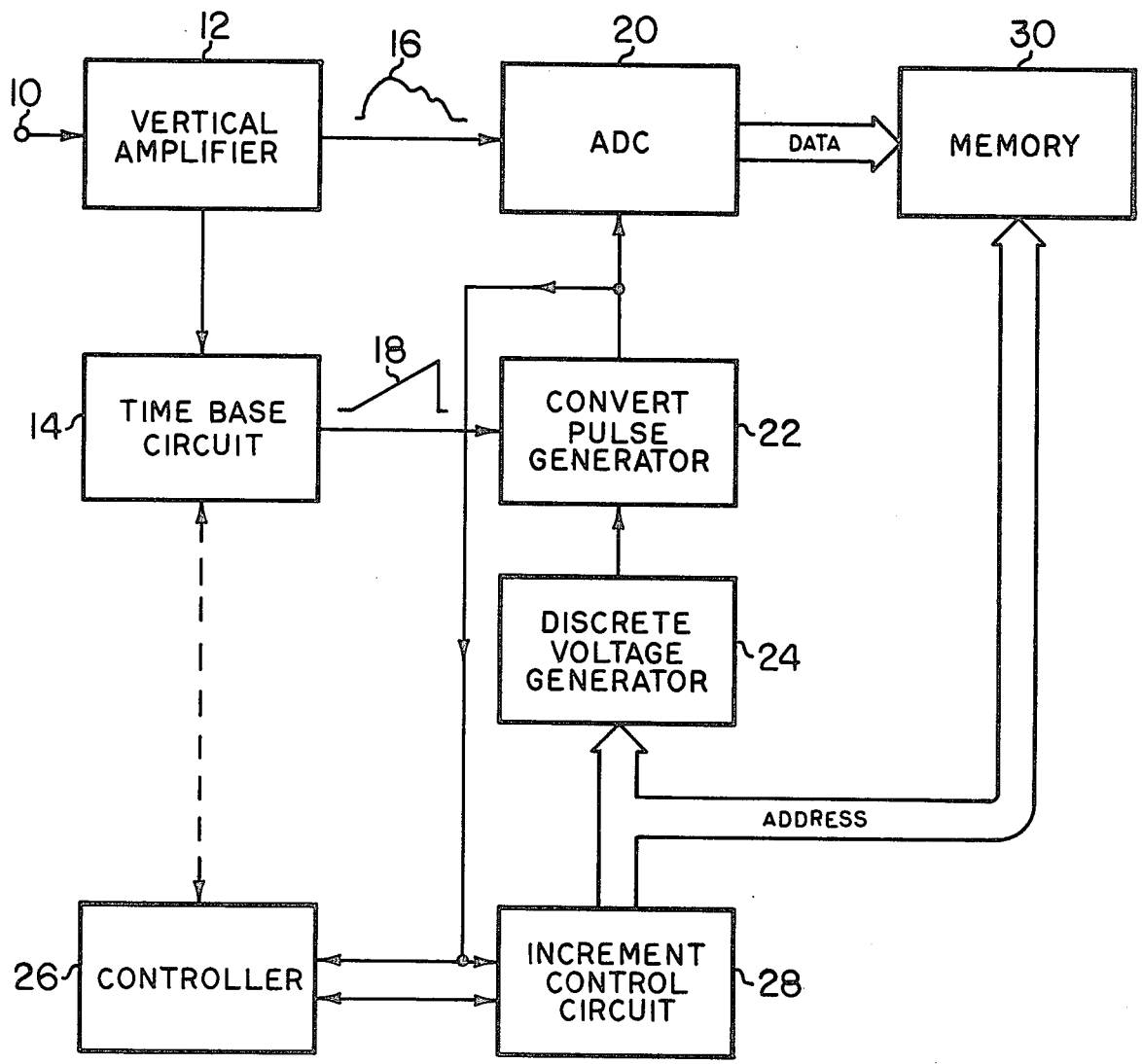
FIG. 1 is a block diagram of a waveform acquisition circuit in accordance with the present invention.

Turning now to the drawings, there is shown in FIG. 1 a block diagram of a waveform acquisition circuit in accordance with the present invention. The waveform acquisition circuit may be part of an oscilloscope or the like, so a vertical amplifier and a time base circuit are shown in FIG. 1 to aid in understanding the waveform graphic relationship; the remaining oscilloscope circuits are irrelevant to the waveform acquisition concept and are not shown. An input signal representing some electrical event is applied via an input terminal 10 to a vertical amplifier 12. A sample of the vertical signal is applied to a timebase circuit 14 to permit a triggered sweep to be initiated at some selected point on the input signal. The vertical amplifier output is shown as a time-varying waveform 16, and would otherwise be utilized to produce vertical deflection of the oscilloscope display. The time base circuit output is shown as a linear sawtooth voltage 18, and would otherwise be utilized to produce horizontal deflection of the oscilloscope display by sweeping an electron-beam spot across the display screen at a constant rate of speed. The time-base circuit 14 suitably may include a sweep rate switch and a plurality of timing components to permit selection of any of a plurality of predetermined sweep rates, which may typically range from one microsecond per display division to five seconds per display division in graduated steps. At this point it should be mentioned that the overall amplitude of sawtooth voltage 18 is constant and represents one display screen width of ten equal divisions. The sweep rate is changed by changing the slope of the sawtooth. For example, for sawtooth signal 18, a higher sweep rate would be indicated by a steeper slope and a consequently shorter sweep duration.

The waveform 16 is applied to an analog-to-digital converter (ADC) 20, which ADC is of the type that samples the instantaneous value of the waveform on receipt of a convert pulse; once the sample is taken, it is converted to digital form by internal logic encoding circuits. The convert pulses for ADC 20 are produced by a convert pulse generator 22, which compares the sawtooth voltage signal 18 with discrete voltage levels produced by a discrete voltage generator 24 and produces a convert pulse each time the sawtooth voltage passes through a discrete voltage level.

The discrete voltage generator 24 produces a predetermined number of programmable voltage levels the amplitudes of which suitably may range from a voltage near the minimum voltage of sawtooth 18 to a voltage near the maximum voltage of sawtooth 18 in equal steps so that a predetermined number of equally-spaced data points for waveform acquisition are established over the length of the time-base sweep. The discrete voltage generator may be implemented in many forms, the most rudimentary being a multiple-tapped voltage divider comprising a string of equal-valued resistors; however, in the preferred embodiment of the present invention, a digital-to-analog converter is employed. The determination of which voltage levels are produced, and in what sequence, is made by a controller 26 and an increment control circuit 28.

The increment control circuit 28 produces a coded signal which is essentially a count signal, each count of which corresponds to a particular data point to be sampled. The count is advanced in accordance with predetermined incremental values which are determined by the controller 26, which may also provide start and stop signals for operation of the waveform acquisition circuit. The controller 26 suitably may be a logic circuit which receives sweep rate information from the time base circuit 14 so that the incremental values are compatible with the sweep rates and may be changed when the sweep rate is changed. For example, the increment may be set to one in cases where the sweep is slow enough to permit all of the data points to be sampled in one sweep. As the sweep rate is increased, the increment may be increased to two (every other data point), three (every third data point), and so on as necessary, in each case staying within the conversion speed capability of ADC 20. Alternatively, controller 26 could be a computer or microprocessor which controls both the sweep rate of time base circuit 14 and the increment value for the increment control circuit 28.

The count output of the increment control circuit 28 is advanced by adding the incremental value to the existing count each time a data point is sampled. The convert pulse from convert pulse generator 22 is utilized in addition to causing a data point to be sampled to update the controller 26 and the increment control circuit 28. Also, since the count output from the increment control circuit 28 is unique to a particular data point, such count output may be used to address a memory 30, into which the waveform data from ADC 20 is stored. For this reason, the data may be stored in memory 30 in its proper waveform sequence irrespective of the order in which the data points are sampled.

It should be noted that if the increment is odd with respect to the number of data points, all of the data points will be sampled without any one point being repeated within a given acquisition cycle. This can best be understood in connection with the idealized waveforms of FIGS. 2A to 2C. In FIG. 2A, three cycles of the sweep sawtooth voltage are shown, which sawtooth may be initiated by the repetitive waveform shown in FIG. 2B in accordance with conventional oscilloscope triggered sweep principles. For simplicity, ten data points 0-9 are provided, and therefore ten discrete voltage levels 0-9 are shown in FIG. 2A. For this example, assume that the increment is three. The dashed line in FIG. 2A is the voltage output of the discrete voltage generator 24, so that in essence, FIG. 2A depicts the comparison by the convert pulse generator 22 of the sawtooth voltage and the discrete voltage levels in generating convert pulses to sample data points along the waveform of FIG. 2B. At the beginning of the acquisition cycle, the discrete voltage generator 24 output is zero and the sawtooth voltage is slightly less than zero. When the sawtooth passes through the zero level, the first convert pulse is generated, causing ADC 20 to sample data point 0 on the waveform of FIG. 2B, the analog value of which is shown in FIG. 2C. The increment control circuit 28 advances the output of discrete voltage generator 24 by three voltage levels so that when the sawtooth voltage passes through the three-volt level, data point 3 along the analog waveform of FIG. 2B is sampled. Similarly, on the first sweep sawtooth cycle, data points 6 and 9 are sampled. On the second sweep sawtooth cycle, data points 2, 5, and 8 are sampled, and on the third sweep sawtooth cycle, data points 1, 4, and 7 are sampled. The stored analog voltages for all of the data points 0-9 are shown in FIG. 2C.

While for this simple example ten data points are shown, it should be realized that greater waveform fidelity is achieved by sampling more data points. That is, the greater number of data points sampled, the more accurately the acquired waveform will represent the incoming signal. Also, since the waveform is being converted to digital form, the resolution of each converted analog data point will contribute to the acquired waveform accuracy. Therefore, for an 8-bit digital system wherein $2^8=256$, a resolution of one part in 256 for each data point sampled, with 256 data points along the waveform, may be adequate. For a 9-bit digital system, 512 data points may conveniently be provided wherein resolution is one part in 512 for each sample. Because a digital system typically has N data lines and is thus designated an N-bit system, it is convenient to utilize $2^N$ for both the number of data points to be sampled and for the resolution of the amplitude of each sample taken. However, it should be pointed out that the number of data points and the resolution value could be different. In fact, in certain situations it may be desirable to selectively sample fewer data points, such as during a triggered single sweep event. Depending upon the sweep rate, every other data point could be sampled, or every third data point, or every fourth, etc., to capture the single sweep event. Therefore, this system lends itself to fast single-shot waveform acquisition with a reduction in accuracy.

Figure 3:
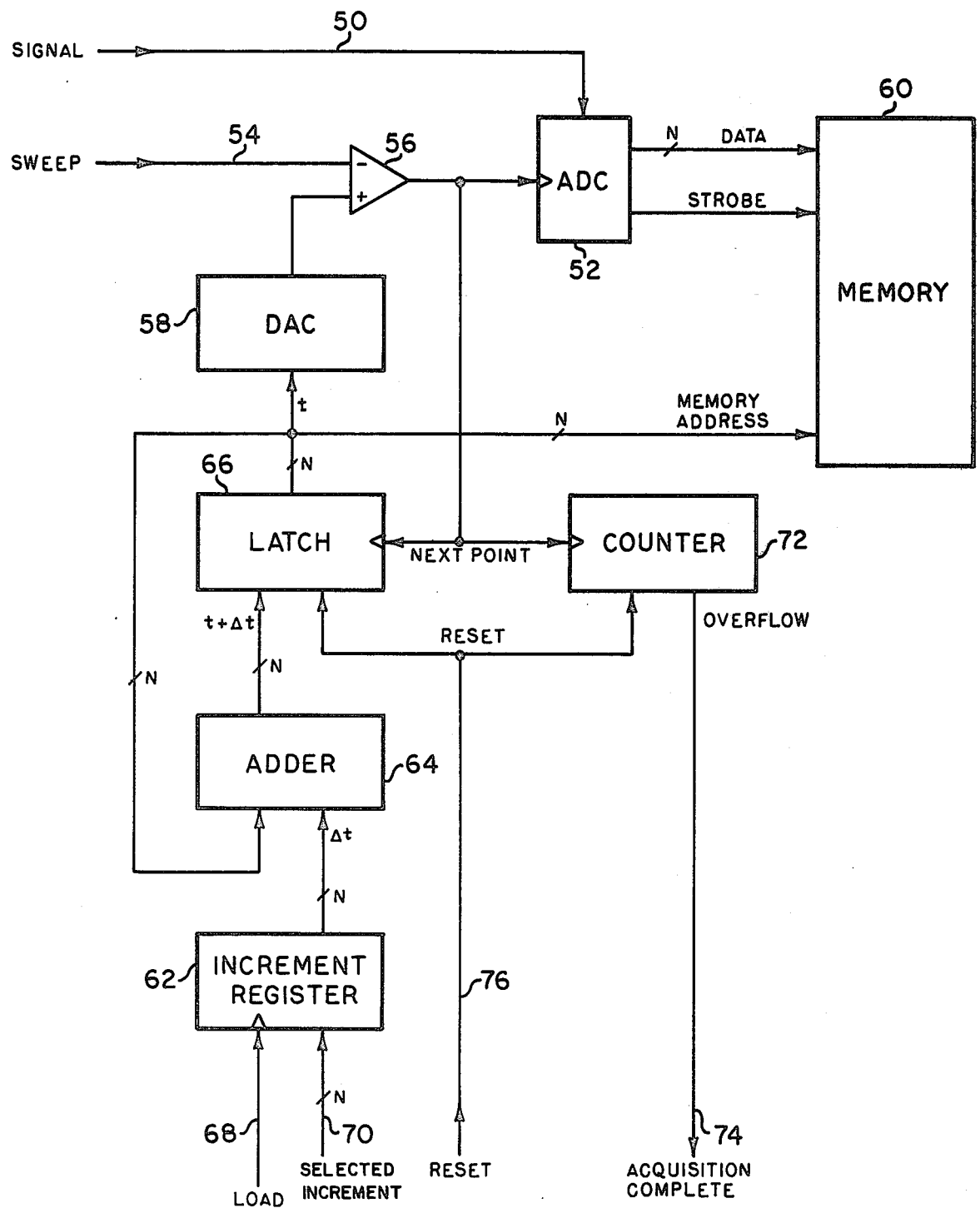
FIG. 3 is a detailed schematic of a preferred embodiment of the present invention.

FIG. 3 shows a detailed schematic of a preferred embodiment of the present invention. A waveform to be acquired is applied via a line 50 to ADC 52. A sweep sawtooth signal is applied via a line 54 to one input of a comparator 56. A digital-to-analog converter (DAC) 58 is provided to convert digital signals to discrete voltage levels which are applied to the other input of a comparator 56. The convert pulse output of comparator 56 is applied to the clock input of ADC 52, causing a sample of the instantaneous amplitude of the analog waveform to be taken. The sample is converted to an N-bit digital number and stored in a memory 60.

An increment control circuit comprises an increment register 62, an adder 64, and a latch 66. Upon receipt of a clock edge via a load command line 68, increment data on line 70 is loaded into the increment register 62 to provide an increment Δt. The increment Δt is added by adder 64 to a digital number representing the previous data point to produce a digital number equal to t+ Δt which represents a new data point. The sum t+ Δt is loaded into latch 66 upon receipt of a convert pulse edge from comparator 56. The new digital number t representing the data point to be sampled is applied to DAC 58 to be converted to a discrete voltage level, and is also utilized as the memory address for memory 60.

A counter 72 is provided to count convert pulses and, hence, the number of data points sampled. When all of the predetermined number of data points are sampled, the counter 72 overflows and the overflow signal is output on line 74 to notify an external controller that the waveform acquisition is complete. The external controller may be a logic circuit or computer as described hereinabove in connection with FIG. 2. Reset signals are applied via a reset line 76 to latch 66 and counter 72 to reset these devices to an initial condition such as zero prior to the commencement of a new acquisition cycle. Furthermore, latch 66 and counter 72 may be held in a reset condition upon completion of an acquisition cycle to prevent further samples from being taken until a command is given either by a program control or by an operator of the instrument embodying the acquisition circuit.

It will, therefore, be appreciated that the aforementioned and other desirable objects have been achieved; however, it should be noted that the particular embodiment of the invention which is shown and described herein is intended as merely illustrative and not as restrictive of the invention.

What I claim as being novel is:

1. A waveform acquisition circuit having a variable acquisition rate, comprising:
    control circuit means including an increment register, an adder circuit, and a latch for providing a digitally selected and incremented digital control signal in accordance with a selectable incremental value, wherein said increment register stores said selectable incremental value, said adder circuit iteratively adds said incremental value to said digital control signal, and said latch holds said digital control signal until updated in response to convert pulses received at a clock input of said latch;
    means for converting said digital control signal to discrete voltage levels;
    means for comparing said discrete voltage levels with a sweep sawtooth voltage and generating said convert pulses thereby, said sweep sawtooth corresponding to the time-base axis of said analog waveform;
    an analog-to-digital converter for converting instantaneous values of said analog waveform to digital waveform data in response to said convert pulses; and
    an addressable waveform memory for storing said digital waveform data, wherein said digital control signal provides addresses for said memory.

2. A waveform acquisition circuit in accordance with claim 1 wherein said control circuit means includes a counter circuit for counting said convert pulses and producing a stop signal at the end of an acquisition cycle.

3. A waveform acquisition circuit in accordance with claim 1 wherein said means for converting said digital control signal to discrete voltage levels comprises a digital-to-analog converter.

4. A waveform acquisition circuit having selectably variable acquisition rates, comprising:
    a time base circuit for generating sawtooth signals having a fixed amplitude and a selectably variable width;
    a discrete voltage generator for generating a plurality of equally-spaced discrete voltage levels over the fixed amplitude range of said sawtooth signals;
    a convert pulse generator coupled to said time base circuit and said discrete voltage generator for generating convert pulses responsive to coincidence of said sawtooth signals and said discrete voltage levels;
    an analog-to-digital converter for converting amplitude values of an analog waveform to digital data in response to said convert pulses; and
    control circuit means for providing digital control signals in accordance with a selectably variable increment to determine the selection of said discrete voltage levels,
    said control circuit means including a register for storing a digital number corresponding to said selectably variable increment, and means for iteratively adding said number to thereby produce said control signal, said adding means operating in response to convert pulses from said convert pulse generator.

5. A waveform acquisition circuit in accordance with claim 4 further comprising a counter circuit for counting said convert pulses, said counter circuit providing a signal upon completion of acquisition of a waveform.

6. A waveform acquisition circuit in accordance with claim 4 further comprising external control means for providing start, stop, and increment values for operation of said waveform acquisition circuit.

7. A waveform acquisition circuit in accordance with claim 4 further comprising a waveform memory for storing said digital data, wherein said control signal also provides addresses for said memory.

* * * * *